United States Patent
Bedell et al.

(10) Patent No.: US 10,204,823 B2
(45) Date of Patent: Feb. 12, 2019

(54) ENHANCING ROBUSTNESS OF SOI SUBSTRATE CONTAINING A BURIED N+ SILICON LAYER FOR CMOS PROCESSING

(71) Applicant: International Business Machines Corporation, Armonk, NY (US)

(72) Inventors: Stephen W. Bedell, Wappingers Falls, NY (US); Stephan A. Cohen, Wappingers Falls, NY (US); Joel P. de Souza, Putnam Valley, NY (US); Karen A. Nummy, Newburgh, NY (US); Daniel J. Poindexter, Cornwall-on-Hudson, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/857,042

(22) Filed: Dec. 28, 2017

(65) Prior Publication Data
US 2018/0122688 A1    May 3, 2018

Related U.S. Application Data

(62) Division of application No. 14/815,314, filed on Jul. 31, 2015, now Pat. No. 9,922,866.

(51) Int. Cl.
*H01L 21/70* (2006.01)
*H01L 29/66* (2006.01)
(Continued)

(52) U.S. Cl.
CPC ...... *H01L 21/76251* (2013.01); *H01L 21/324* (2013.01)

(58) Field of Classification Search
CPC ......... H01L 21/76264; H01L 21/76251; H01L 21/324; H01L 21/763; H01L 21/762;
(Continued)

(56) References Cited

U.S. PATENT DOCUMENTS 5,659,192 A * 8/1997 Sarma ................. H01L 21/2007
257/347
6,476,448 B2    11/2002 Yeh et al.
(Continued)

FOREIGN PATENT DOCUMENTS

CN    102427052 B    12/2013
CN    104485309 A    4/2015

OTHER PUBLICATIONS

List of IBM Patents or Patent Applications Treated as Related dated Dec. 28, 2017, 2 pages.

*Primary Examiner* — Thao X Le
*Assistant Examiner* — Nduka Ojeh
(74) *Attorney, Agent, or Firm* — Scully, Scott, Murphy & Presser, P.C.; L. Jeffrey Kelly, Esq.

(57) ABSTRACT

A silicon buffer layer selected from undoped silicon, p-doped silicon or a multilayered stack of, in any order, undoped silicon and p-doped silicon is provided between an n+ silicon layer and an oxide layer of an SOI substrate. The presence of the silicon buffer layer reduces electron injection into the oxide layer during device processing which requires an electric field.

7 Claims, 3 Drawing Sheets

(51) Int. Cl.
*H01L 21/762* (2006.01)
*H01L 21/324* (2006.01)

(58) Field of Classification Search
CPC ..... H01L 2027/11857; H01L 27/11203; H01L 21/84; H01L 29/66772; H01L 27/12; H01L 27/1214
USPC .......... 257/E27.112, 347, E21.122, E21.285, 257/E21.409, E27.084, 304, 506; 438/154, 458, 155
See application file for complete search history.

(56) References Cited

U.S. PATENT DOCUMENTS

| | | | |
|---|---|---|---|
| 6,482,704 | B1 | 11/2002 | Amano et al. |
| 6,911,379 | B2 * | 6/2005 | Yeo .................. H01L 21/76254 257/E21.568 |
| 8,482,009 | B2 | 7/2013 | Dyer et al. |
| 8,492,844 | B2 | 7/2013 | Enders et al. |
| 8,653,596 | B2 | 2/2014 | Cheng et al. |
| 8,685,806 | B2 | 4/2014 | Dyer et al. |
| 9,059,245 | B2 | 6/2015 | Chen et al. |
| 9,070,604 | B2 | 6/2015 | Yamazaki et al. |
| 2003/0119280 | A1 * | 6/2003 | Lee .................. H01L 21/76254 438/459 |
| 2004/0248363 | A1 * | 12/2004 | Bard .................. H01L 21/84 438/243 |
| 2005/0087805 | A1 | 4/2005 | Ning |
| 2009/0090983 | A1 | 4/2009 | Adkisson et al. |
| 2009/0134460 | A1 | 5/2009 | Adam et al. |
| 2010/0155880 | A1 | 6/2010 | Ban et al. |
| 2011/0114918 | A1 | 5/2011 | Lin et al. |
| 2011/0193149 | A1 | 8/2011 | Dyer et al. |
| 2012/0003813 | A1 | 1/2012 | Chuang et al. |
| 2012/0138953 | A1 * | 6/2012 | Cai .................. H01L 21/823807 257/77 |
| 2012/0181609 | A1 | 7/2012 | Enders et al. |
| 2012/0286264 | A1 | 11/2012 | Suzuki et al. |
| 2013/0009237 | A1 * | 1/2013 | Grebs .................. H01L 29/66727 257/330 |
| 2013/0175595 | A1 * | 7/2013 | Cheng .................. H01L 21/84 257/304 |
| 2013/0214356 | A1 * | 8/2013 | Cheng .................. H01L 21/84 257/347 |

* cited by examiner

US 10,204,823 B2

ENHANCING ROBUSTNESS OF SOI SUBSTRATE CONTAINING A BURIED N+ SILICON LAYER FOR CMOS PROCESSING

BACKGROUND

The present application relates to semiconductor technology, and more particularly to a semiconductor-on-insulator substrate (SOI) containing an undoped and/or p-doped silicon buffer layer located between an $n^+$ silicon layer and an oxide layer of the SOI substrate. The present application also relates to a method of forming such a SOI substrate. The present application also provides an annealing process that can be used to minimize or eliminate electron traps in the oxide layer of any SOI substrate.

Semiconductor-on-insulator (SOI) technology refers to the use of a layered semiconductor-insulator-semiconductor substrate such as for example, silicon-oxide-silicon, in place of a conventional bulk semiconductor (i.e., Si) substrate in semiconductor manufacturing, especially microelectronics. The implementation of SOI technology is one of several manufacturing strategies employed in the semiconductor industry to allow for the continued miniaturization of microelectronic devices. Reported benefits of SOI technology relative to conventional bulk complementary metal oxide semiconductor (CMOS) processing include, for example, lower parasitic capacitance due to isolation from the bulk semiconductor substrate, which improves power consumption at matched performance, and/or resistance to latch-up due to complete isolation of n- and p-well structures, and/or higher performance at equivalent VDD, and/or reduced temperature due to no doping, and/or better yield to high density, and/or lower leakage currents due to isolation thus higher power efficiency, and/or inherent radiation hardened.

From a manufacturing perspective, SOI substrates are compatible with most conventional fabrication processes. In general, an SOI-based process may be implemented without special equipment or significant retooling of an existing factory.

Despite the above, improvements with existing SOI substrates are needed particularly concerning the minimization or elimination of electron traps in the buried oxide layer of SOI substrates. Also needed is a new and improved SOI substrate that has enhanced robustness and improved buried oxide degradation.

SUMMARY

A silicon buffer layer selected from undoped silicon, p-doped silicon or a multilayered stack of, in any order, undoped silicon and p-doped silicon is provided between an $n^+$ silicon layer and an oxide layer of a semiconductor-on-insulator (SOI) substrate. The presence of the silicon buffer layer reduces electron injection into the oxide layer during device processing which requires an electric field.

In one aspect of the present application, a semiconductor-on-insulator (SOI) substrate that has enhanced robustness and improved buried oxide degradation is provided. In one embodiment of the present application, the SOI substrate includes from bottom to top, a silicon handle substrate, an $n^+$ silicon layer, a silicon buffer layer, an oxide layer, and a $p^-$ silicon layer. The silicon buffer layer is selected from undoped silicon, p-doped silicon or a multilayered stack of, in any order, undoped silicon and p-doped silicon.

In another aspect of the present application, a method of forming a semiconductor-on-insulator (SOI) substrate is provided. In one embodiment of the present application, the method includes providing a first wafer comprising an oxide layer and a precursor $p^-$ silicon layer and a second wafer comprising, from bottom to top, a silicon handle substrate, an $n^+$ silicon layer and a silicon buffer layer, the silicon buffer layer is selected undoped silicon, p-doped silicon or a multilayered stack of, in any order, undoped silicon and p-doped silicon. Next, a surface of the oxide layer of the first wafer is brought into intimate contact with a surface of the silicon buffer layer of the second wafer. The first wafer is then bonded to the second wafer and a portion of the precursor $p^-$ silicon layer is removed to provide a semiconductor-on-insulator substrate comprising from bottom to top, the silicon handle substrate, the $n^+$ silicon layer, the silicon buffer layer, the oxide layer, and a remaining portion of the precursor $p^-$ silicon layer.

In yet another aspect of the present application, a method is provided that minimizes or eliminates electron traps in an oxide layer of an SOI substrate containing such traps. In one embodiment of the present application, the method includes providing a semiconductor-on-insulator (SOI) substrate having an oxide layer that contains a first quantity of electron traps. The method continues by annealing the SOI substrate to provide the oxide layer with a second quantity of electron traps, wherein the second quantity of the electron traps is less than the first quantity of the electron traps.

DETAILED DESCRIPTION

Figure 1:
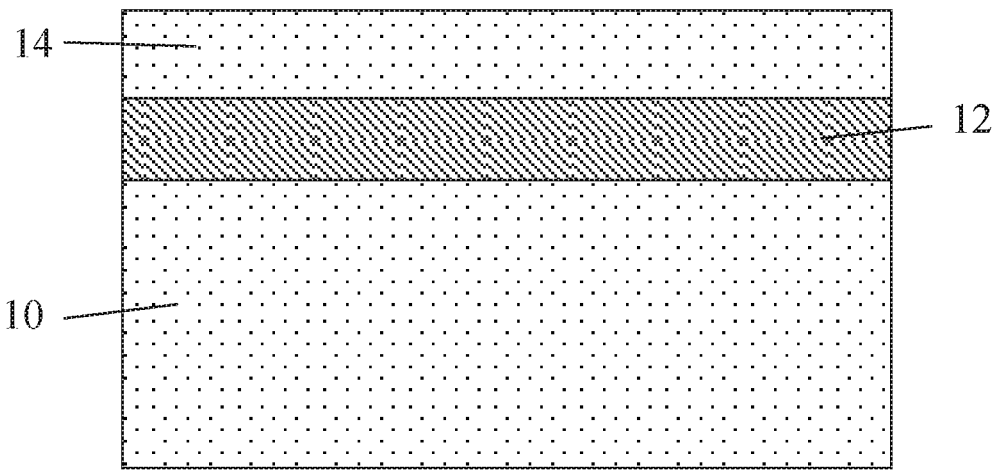
FIG. 1 is a cross sectional view of an exemplary semiconductor-on-insulator (SOI) substrate including, from bottom to top, a $p^-$ silicon handle substrate, an oxide layer, and a $p^-$ silicon layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
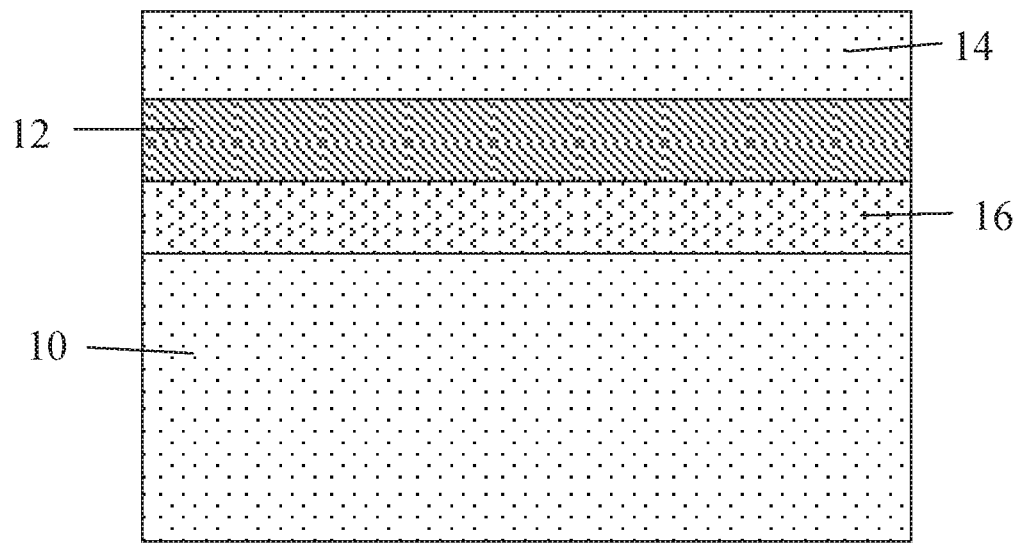
FIG. 2 is a cross sectional view of another exemplary semiconductor-on-insulator (SOI) substrate including, from bottom to top, a $p^-$ silicon handle substrate, an $n^+$ silicon layer, an oxide layer, and a $p^-$ silicon layer.

As shown in FIG. 1, SOI substrates conventionally use a p$^-$ silicon handle substrate 10 under an oxide layer 12 and a p$^-$ silicon layer 14 above the oxide layer 12; oxide layer 12 may also be referred to herein as a buried oxide (BOX) layer. The SOI substrate shown in FIG. 1 can be formed by wafer bonding or by SIMOX (Separation by IMplantation of OXygen). SOI material technology has been optimized since its inception to provide high yield SOI based CMOS products. However, a structural change as illustrated in FIG. 2 was introduced into the SOI structure shown in FIG. 1 for 22 nm and beyond CMOS technology. Notably, the aforementioned structure change, which is illustrated in FIG. 2, included the introduction of a several micron thick n$^+$ silicon layer 16 between the BOX layer 12 and the p silicon handle substrate 10; the SOI substrate shown in FIG. 2 can be formed by wafer bonding. This structural change introduced a profound change in electric field across the BOX layer 12 and provided a pathway for electrons to be injected into the BOX layer 12 from the p$^-$ silicon handle substrate 10 and holes to be injected from the overlaying p$^-$ silicon layer 14 under nominal plasma processes (grounded substrate). In the presence of traps in the BOX layer 12, accelerated degradation and failure of the BOX layer 12 typically occurs. Such failure can be determined by time dependent dielectric breakdown (TDDB) measurements.

The present application provides an annealing process that can be used to improve existing SOI substrates such as shown in FIG. 2 by minimizing or eliminating electron traps in the buried oxide layer of such SOI substrates as well as providing a new and improved SOI substrate that has enhanced robustness and improved buried oxide degradation as compared to existing SOI substrates. Notably, the present application provides three embodiments that can be used to control premature BOX degradation. In one embodiment (I), the introduction of a thin silicon buffer layer, as described below, can be provided above the n$^+$ silicon layer of a SOI substrate such that electron injection from the n$^+$ silicon layer into the BOX layer is minimized. In a second embodiment (II), a high temperature annealing of an SOI substrate can be used to minimize or eliminate electron traps in the BOX layer without making any changes to the n$^+$ silicon layer and/or the silicon handle substrate. Lastly, and in a third embodiment (III), a combination of embodiments (I) and (II) can be used.

Applicant has shown that I-V characteristics of the virgin oxide used to form BOX layers show ideal Fowler-Nordheim breakdown behavior without any noticeable trap related activity as evident from I-V vs. temperature measurements. However, I-V characteristics of the same oxide layer in an SOI configuration show increased leakage as a function of measurement temperature indicating degradation of the oxide due to H$^+$ implantation used to form the SOI substrate and apparent inadequate post-implant annealing. Another important aspect of the present application is related to the control of the bonding bottom BOX/n$^+$ silicon or handle substrate interface. Since BOX degradation is related to charge injection, lack of control of this interface may lead to variability in charge injection and thus spatially variable BOX degradation and/or BOX failure.

Figure 3:
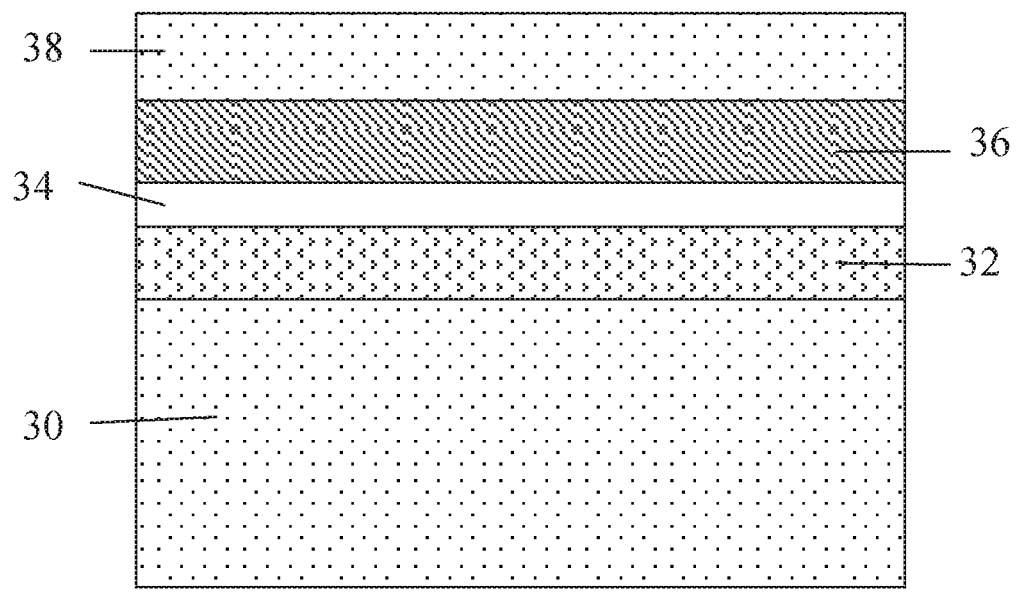
FIG. 3 is a cross sectional view of an exemplary semiconductor-on-insulator (SOI) substrate of including, from bottom to top, a silicon handle substrate, an $n^+$ silicon layer, a silicon buffer layer, an oxide layer, and a $p^-$ silicon layer in accordance with an embodiment of the present application.

Reference is first made to FIG. 3, which illustrates an exemplary semiconductor-on-insulator (SOI) substrate of the present application. The exemplary semiconductor-on-insulator (SOI) substrate illustrated in FIG. 3 includes from bottom to top, a silicon handle substrate 30, an n$^+$ silicon layer 32, a silicon buffer layer 34, an oxide layer 36, and a p$^-$ silicon layer 38. In accordance with this embodiment of the present application, the presence of the silicon buffer layer 34 aids in controlling the premature degradation of the oxide layer 36. In such an embodiment, the silicon buffer layer 34 minimizes injections of electrons from the n$^+$ silicon layer 32 into the oxide layer 36.

The various silicon layers (i.e., layers 10, 14, 16, 30, 32, 34 and 38) that comprise the SOI substrates shown in FIGS. 1, 2, and 3 may comprise a same or different crystal orientation. For example, the crystal orientation of the various silicon layers (i.e., layers 10, 14, 16, 30, 32, 34 and 38) that comprise the SOI substrates shown in FIGS. 1, 2, and 3 may be {100}, {110}, or {111}. Other crystallographic orientations besides those specifically mentioned can also be used in the present application. Typically, silicon layers 10 and 16 or silicon layers 30, 32 and 34 comprise a same crystal orientation.

The various silicon layers (i.e., layers 10, 14, 16, 30, 32, 34 and 38) of the SOI substrates shown in FIGS. 1, 2 and 3 may be single crystalline silicon, polycrystalline silicon, or amorphous silicon. Typically, at least the topmost silicon layer (i.e., layers 16 and 38) of the SOI substrates shown in FIGS. 1, 2 and 3 is a single crystalline silicon.

The term "n" or "n-type" when used in describing a silicon layer of the SOI substrates shown in FIGS. 1, 2 and 3 denotes the addition of impurities that contribute free electrons to an intrinsic semiconductor. For silicon, n-type dopants include at least one element from Group VA of the Periodic Table of Elements (e.g., P and/or As). The term "p" or "p-type" refers to the addition of impurities to an intrinsic semiconductor that creates deficiencies of valence electrons. For silicon, p-type dopants include at least one element from Group IIIA of the Periodic Table of Elements (e.g., Al and/or B).

The oxide layer (i.e., layer 12 or 36) of the SOI substrates shown in FIGS. 1, 2 and 3 may be a crystalline or non-crystalline oxide; oxide layers 12 and 36 may be referred to herein as BOX layers since the oxide layer is located between silicon layers. In one embodiment, the oxide layer (i.e., layer 12 or 36) of the SOI substrates can be composed of silicon dioxide. In some embodiments (not shown), a nitride layer for example, silicon nitride or boron nitride, can be formed atop the oxide layer (i.e., layer 12 or 36) and positioned between the oxide layer and the topmost silicon layer (i.e., layer 14 or 38) of the SOI substrate.

Throughout the present application, the term p$^-$ silicon denotes a silicon layer that has a p-type dopant present in a concentration from $10^{14}$ atoms/cm$^3$ to $10^{19}$ atoms/cm$^3$. In one example, the p-type dopant concentration for the p$^-$ silicon layers in the SOI substrates shown in FIGS. 1, 2 and 3 can be from $10^{14}$ atoms/cm$^3$ to $10^{18}$ atoms/cm$^3$.

Throughout the present application, the term n$^-$ silicon layer denotes a silicon layer that has an n-type dopant present in a concentration from $10^{14}$ atoms/cm$^3$ to $10^{19}$ atoms/cm$^3$. In one example, the n-type dopant concentration for the n$^-$ silicon layers in the SOI substrates can be from $10^{14}$ atoms/cm$^3$ to $10^{18}$ atoms/cm$^3$.

Throughout the present application, the term n$^+$ silicon denotes a silicon layer that has a n-type dopant present in a concentration from $10^{14}$ atoms/cm$^3$ to $10^{20}$ atoms/cm$^3$. In one example, the n-type dopant concentration for n$^+$ silicon layers in the SOI substrates shown in FIGS. 1, 2 and 3 can be from $10^{18}$ atoms/cm$^3$ to $10^{20}$ atoms/cm$^3$. The n$^+$ silicon layer has a higher n-type dopant concentration than the n$^-$ silicon layer.

Referring back to FIG. 3 each of the silicon handle substrate 30, the n$^+$ silicon layer 32, the silicon buffer layer 34, and the p$^-$ silicon layer 38 may be comprised of single crystalline silicon. In some embodiments of the present application, the silicon handle substrate 30, the n$^+$ silicon layer 32, and the silicon buffer layer 34 have an epitaxial relationship, same crystallographic orientation, with each other.

In one embodiment of the present application, the silicon handle substrate 30 is undoped. In another embodiment of the present application, the silicon handle substrate 30 is a p silicon handle substrate. In yet another embodiment, the silicon handle substrate 30 is an n$^-$ silicon handle substrate.

In one embodiment of the present application, the silicon buffer layer 34 consists of undoped Si. In another embodiment, the silicon buffer layer 34 consists of p-doped silicon having a p-dopant concentration of from $10^{14}$ atoms/cm$^3$ to $10^{18}$ atoms/cm$^3$. Other p-type dopant concentrations that are lesser than, or greater than, the aforementioned range can be used for the p-type dopant concentration of silicon buffer layer 34. In some embodiments, the silicon buffer layer 34 includes a material stack of, in any order, undoped silicon and p-doped silicon. The number of layers of undoped silicon and p-doped silicon within such a multilayered silicon buffer layer 34 may vary.

In one embodiment of the present application and as illustrated in FIG. 3, a first surface of the silicon buffer layer 34 is in direct physical contact with a surface of the oxide layer 36 and a second a second surface of the silicon buffer layer 34 that is opposite the first surface directly contacts the n$^+$ silicon layer 32.

In one embodiment of the present application, silicon handle substrate 30 may have a thickness from 700 μm to 800 μm. Other thicknesses that are lesser than, or greater than, the aforementioned thickness range may also be employed for the silicon handle substrate 30. In one embodiment of the present application, the n$^+$ silicon layer 32 may have a thickness from 1 micron to 10 microns. Other thicknesses that are lesser than, or greater than, the aforementioned thickness range may also be employed for the n$^+$ silicon layer 32. In one embodiment of the present application, the silicon buffer layer 34 may have a thickness from 100 nm to 2000 nm. Other thicknesses that are lesser than, or greater than, the aforementioned thickness range may also be employed for the silicon buffer layer 34. In one embodiment of the present application, the oxide layer 36 may have a thickness from 10 nm to 10,000 nm. Other thicknesses that are lesser than, or greater than, the aforementioned thickness range may be employed for the oxide layer 36. In one embodiment of the present application, the p$^-$ silicon layer 38 may have a thickness from 5 nm to 10,000 nm. Other thicknesses that are lesser than, or greater than, the aforementioned thickness range may also be employed for the p$^-$ silicon layer 38.

As mentioned above, presence of the silicon buffer layer 34 as shown in FIG. 3 between the oxide layer 36 and the n$^+$ silicon layer 32 aids in controlling the premature degradation of the oxide layer 36. In such an embodiment, the silicon buffer layer 34 minimizes injections of electrons from the n$^+$ silicon layer 32 into the oxide layer 36 and thus provides a more robust SOI substrate.

Figure 4A:
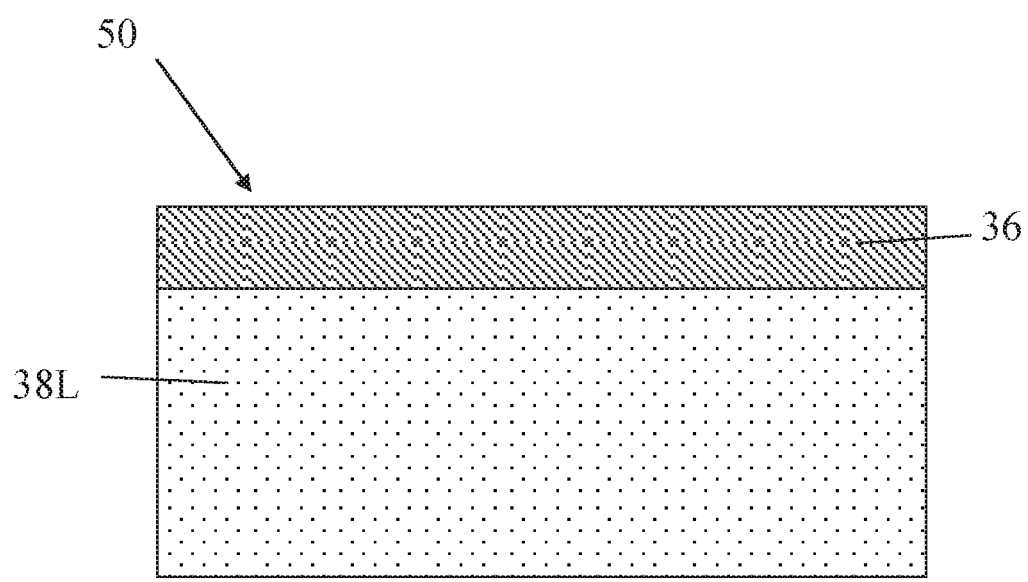
FIG. 4A is a cross sectional view of a first wafer that can be used in providing the exemplary semiconductor-on-insulator substrate illustrated in FIG. 3.
Figure 4B:
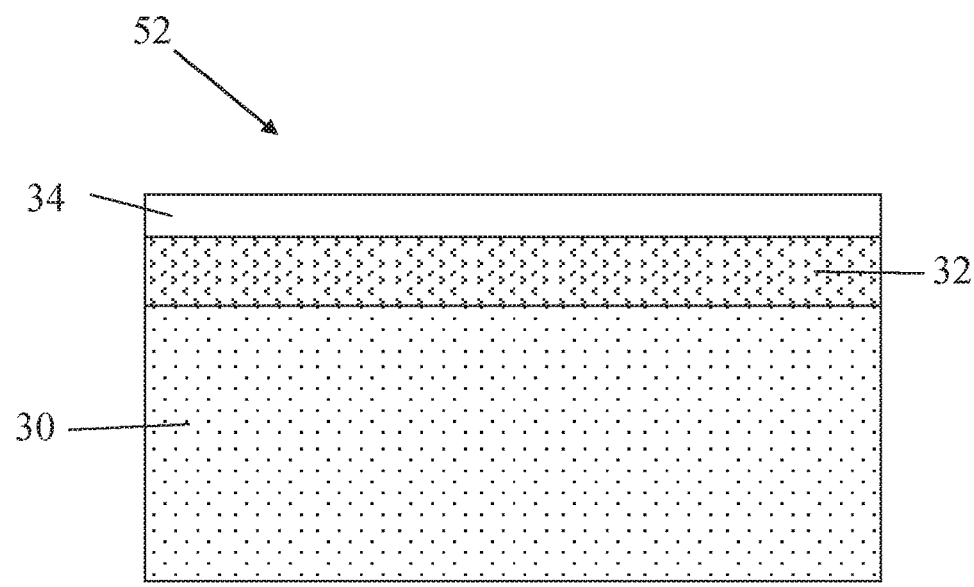
FIG. 4B is a cross sectional view of a second wafer that can be used in providing the exemplary semiconductor-on-insulator substrate illustrated in FIG. 3.
Figure 5:
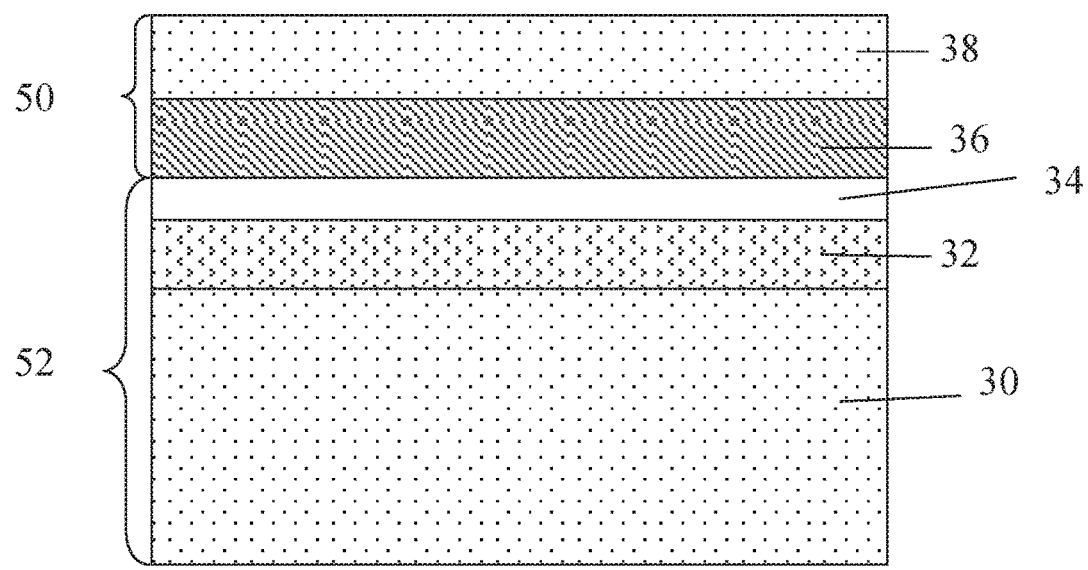
FIG. 5 is a cross sectional view of the first and second wafers shown in FIGS. 4A and 4B after bringing the two wafers into intimate contact with each other, bonding the first and second wafers together, and removing a portion of a precursor $p^-$ silicon layer of the first wafer.

Referring now to FIGS. 4A, 4B and 5, there are illustrated a method that can be used in forming the SOI substrate shown in FIG. 3. Notably, FIG. 4A illustrates a first wafer 50 that can be used in providing the exemplary semiconductor-on-insulator substrate illustrated in FIG. 3. First wafer 50 includes an oxide layer 36 located on a surface of a precursor p$^-$ silicon layer 38L. The precursor p$^-$ silicon layer 38L is used in providing the p$^-$ silicon layer 38 shown in FIG. 3. In one embodiment of the present application, oxide layer 36 may be thermally grown on the surface of the precursor p$^-$ silicon layer 38L. In such an embodiment, an oxidation process can be used to provide the oxide layer 36 on the precursor p$^-$ silicon layer 38L. In another embodiment of the present application, the oxide layer 36 may be formed on the precursor p silicon layer 38L by utilizing a deposition process such as, for example, chemical vapor deposition or chemical vapor deposition. The precursor p$^-$ silicon layer 38L includes a layer releasing implant region (not shown) containing H$^+$, He$^+$ or a combination of H$^+$ and He$^+$ that is formed somewhere near an upper portion of the precursor p$^-$ silicon layer 38L. After bonding to the second wafer, an anneal may be used to cleave a portion of the precursor p$^-$ silicon layer 38L using the layer releasing implant region to initiate crack propagation and cleavage to provide the p$^-$ silicon layer 38 of the SOI substrate of the present application.

FIG. 4B illustrates a second wafer 52 that can be used in providing the exemplary semiconductor-on-insulator substrate illustrated in FIG. 3. The second wafer 52 comprises, from bottom to top, a silicon handle substrate 30, an n$^+$ silicon layer 32 and a silicon buffer layer 34. As stated above, silicon buffer layer 34 is selected from undoped silicon, p-doped silicon or a multilayered stack of, in any order, undoped silicon and p-doped silicon.

In one embodiment of the present application, the second wafer 52 may be formed by first providing the silicon handle substrate 30. The silicon handle substrate 30 can be formed by introducing a p-type dopant (or an n-type dopant) into intrinsic silicon utilizing one of ion implantation or gas phase doping. A dopant activation anneal may follow the dopant introduction step. Next, the n$^+$ silicon layer 32 can be epitaxially grown on a surface of the silicon handle substrate 30, followed by the epitaxial growth of the silicon buffer layer 34 on a surface of the n$^+$ silicon layer 32.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation.

Examples of various epitaxial growth processes that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 1100° C. A number of well known silicon forming precursor source gases may be used for the deposition of the $n^+$ silicon layer 32 and the silicon buffer layer 34. Carrier gases like hydrogen, nitrogen, helium and argon can be used.

In some embodiments, intrinsic silicon or an intrinsic silicon material stack may be epitaxially grown, and thereafter the appropriate dopant or dopants can be introduced into the intrinsic silicon or the intrinsic silicon material stack in order to provide the $n^+$ silicon layer 32 and the silicon buffer layer 34.

In yet another embodiment, the second wafer 52 can be formed by first providing a base silicon substrate. In one embodiment, the base silicon substrate may be undoped. In yet another embodiment, the base silicon substrate may be doped. Next, a p-type dopant (or an n-type dopant) can be introduced within a lower portion of the base silicon substrate to provide the silicon handle substrate 30. In some embodiments, and when the base substrate is p-type doped or n-type doped, this step may be omitted. Next, an n-type dopant can be introduced in a middle portion of the base silicon substrate to provide the $n^+$ silicon layer 32. A dopant activation anneal may follow the introduction of dopant within a particular semiconductor material. In some embodiments, and when the base substrate is n-type doped, this step may be omitted. In some embodiments, in which the base silicon substrate is undoped or p-type dopant, an upper portion of the base silicon substrate can provide the silicon buffer layer 34. In yet another embodiment, p-type dopants can be introduced into the upper portion of the base silicon substrate. The introduction of dopants can be performed by ion implantation or gas phase doping. A dopant activation anneal may follow the introduction of dopant within a particular semiconductor material.

At this point of the present application, the oxide layer 36 of the first wafer 50, the silicon buffer layer 34 of the second wafer 52 or both the oxide layer 36 of the first wafer 50 and the silicon buffer layer 34 of the second wafer 52 can be subjected to a plasma activation process. The plasma activation process adds charge and/or dangle bonds to the oxide layer 36 and/or silicon buffer layer 34 which may aid in subsequent bonding of the first and second wafers. The plasma activation process can be performed in a plasma of $O_2$, $N_2$, an inert gas, or any mixture thereof. The plasma activation process can be performed at temperatures that are well known to those skilled in the art.

Referring now to FIG. 5, there is illustrated the structure that is formed after bringing the first wafer 50 shown in FIG. 4A into intimate contact with the second wafer 52, bonding the first and second wafers (50, 52) together, and thereafter removing a portion of the precursor $p^-$ silicon layer 38L to provide an SOI in accordance with the present application. Notably, and as is shown, a surface of the oxide layer 36 (with or without plasma activation) of the first wafer 50 is brought into intimate contact with a surface of the silicon buffer layer 34 (with or without plasma activation) of the second wafer 52. The bringing of the two wafers (50, 52) into intimate contact with each other may be performed by hand or by mechanical means such as, for example, a robot arm. After bringing the two wafers (50, 52) into intimate contact with each other, an external force or load may be applied to at least one of the two wafers. Next, bonding of the two contacting wafers is performed. The bonding is performed using any bonding temperature that forms a sufficient bonding interface between the oxide layer 36 and the silicon buffer layer 34. Bonding is typically performed in an inert ambient including, for example, He, Ar, or mixtures thereof. Bonding provides the SOI substrate of the present application. Following bonding, cleaving of the precursor $p^-$ silicon layer 38L is performed utilizing techniques well known in the art to provide the $p^-$ silicon layer 38 of the SOI substrate of the present application.

In some embodiments of the present application, an annealing can be performed on the semiconductor-on-insulator substrate shown in FIG. 3 or 5 to eliminate or reduce electron traps that are present in the oxide layer 36. When such a step is conducted, the anneal can be performed at a temperature sufficient to cause electron trap reduction, while maintaining the integrity of the structure. The anneal may be performed in a variety of ambients including, but not limited to an inert ambient such as, for example He or Ar.

Although the annealing is mentioned for eliminating or reducing electron traps that are present in the oxide layer 36 of the SOI substrate of the present application, the same annealing can be used to eliminate or reduce electron traps that are present in the oxide layer of any SOI substrate including the ones illustrated in FIGS. 1 and 2. As such, the present application also provides a method that includes providing a semiconductor-on-insulator (SOI) substrate having an oxide layer that contains a first quantity of electron traps. The method continues by annealing the SOI substrate as described above to provide the oxide layer with a second quantity of electron traps, wherein the second quantity of the electron traps is less than the first quantity of the electron traps.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor-on-insulator (SOI) substrate comprising from bottom to top,
    a silicon handle substrate;
    an $n^+$ silicon layer;
    a silicon buffer layer consisting of undoped silicon;
    an oxide layer; and
    a $p^-$ silicon layer; wherein a first surface of said silicon buffer layer is in direct physical contact with a surface of said oxide layer.

2. The SOI substrate of claim 1, wherein a second surface of said silicon buffer layer that is opposite said first surface directly contacts said $n^+$ semiconductor layer.

3. The SOI substrate of claim 1, wherein each of said silicon handle substrate, said $n^+$ silicon layer, and said silicon buffer layer have an epitaxial relationship with each other.

4. The SOI substrate of claim 1, wherein said silicon handle substrate is a p$^-$ semiconductor substrate.

5. A semiconductor-on-insulator (SOI) substrate comprising from bottom to top,
- a silicon handle substrate;
- an n$^+$ silicon layer;
- a silicon buffer layer consisting of a multilayered stack of, in any order, undoped silicon and p-doped silicon;
- an oxide layer; and
- a p$^-$ silicon layer wherein said p-doped silicon of said multilayered stack is in direct physical contact with said n+ silicon layer, and said undoped silicon of said multilayered stack is in direct physical contact with said oxide layer.

6. The SOI substrate of claim 5, wherein each of said silicon handle substrate, said n$^+$ silicon layer, and said silicon buffer layer have an epitaxial relationship with each other.

7. The SOI substrate of claim 5, wherein said silicon handle substrate is a p$^-$ semiconductor substrate.

* * * * *